US009502088B2

(12) United States Patent
Jung et al.

(10) Patent No.: US 9,502,088 B2
(45) Date of Patent: Nov. 22, 2016

(54) CONSTANT SENSING CURRENT FOR READING RESISTIVE MEMORY

(71) Applicant: QUALCOMM Incorporated, San Diego, CA (US)

(72) Inventors: Seong-Ook Jung, Seoul (KR); Sara Choi, Seoul (KR); Jisu Kim, Seoul (KR); Taehui Na, Seoul (KR); Jung Pill Kim, San Diego, CA (US); Seung Hyuk Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/499,155

(22) Filed: Sep. 27, 2014

(65) Prior Publication Data

US 2016/0093351 A1 Mar. 31, 2016

(51) Int. Cl.
| | |
|---|---|
| G11C 11/16 | (2006.01) |
| G11C 7/14 | (2006.01) |
| G11C 7/06 | (2006.01) |
| G11C 7/08 | (2006.01) |
| G11C 13/00 | (2006.01) |

(52) U.S. Cl.
CPC .......... G11C 11/1673 (2013.01); G11C 7/062 (2013.01); G11C 7/08 (2013.01); G11C 7/14 (2013.01); G11C 13/004 (2013.01); G11C 2013/0045 (2013.01); G11C 2013/0054 (2013.01)

(58) Field of Classification Search
CPC .......... G11C 7/062; G11C 7/08; G11C 7/14; G11C 11/1673; G11C 13/004; G11C 13/0045; G11C 13/0054

USPC ........... 365/158, 209, 213; 327/53, 132, 490
See application file for complete search history.

(56) References Cited

U.S. PATENT DOCUMENTS

| 6,421,270 | B1 | 7/2002 | Tai | |
|---|---|---|---|---|
| 6,700,814 | B1 * | 3/2004 | Nahas | G11C 7/06 365/158 |
| 7,705,664 | B2 | 4/2010 | Tang | |
| 8,422,269 | B2 | 4/2013 | Sasaki et al. | |
| 8,422,280 | B2 | 4/2013 | Choi | |

(Continued)

OTHER PUBLICATIONS

Partial International Search Report—PCT/US2015/051208—ISA/EPO—Dec. 15, 2015.

(Continued)

*Primary Examiner* — Vu Le
*Assistant Examiner* — Sung Cho
(74) *Attorney, Agent, or Firm* — Muncy, Geissler, Olds & Lowe, P.C.

(57) ABSTRACT

Systems and methods relate to providing a constant sensing current for reading a resistive memory element. A load voltage generator provides a load voltage based on a current mirror configured to supply a constant current that is invariant with process-voltage-temperature variations. A data voltage is generated based on the generated load voltage, by passing a sensing current mirrored from the constant current, through the resistive memory element. A reference voltage is generated, also based on the generated load voltage and by passing reference current mirrored from the constant current, through reference cells. A logical value stored in the resistive memory element is determined based on a comparison of the data voltage and the reference voltage, where the determination is free from effects of process-voltage-temperature variations.

18 Claims, 4 Drawing Sheets

(56) References Cited

U.S. PATENT DOCUMENTS

| | | | |
|---|---|---|---|
| 8,693,273 B2 | 4/2014 | Yuh et al. | |
| 2008/0019192 A1* | 1/2008 | Wang | G11C 7/062 |
| | | | 365/189.06 |
| 2008/0150538 A1* | 6/2008 | Andreis | G01V 3/12 |
| | | | 324/365 |
| 2008/0150638 A1* | 6/2008 | Seth | G05F 3/205 |
| | | | 330/296 |
| 2010/0157654 A1* | 6/2010 | Jung | G11C 7/12 |
| | | | 365/148 |
| 2011/0122684 A1 | 5/2011 | Sheu et al. | |
| 2011/0176350 A1* | 7/2011 | Jung | G11C 11/16 |
| | | | 365/148 |
| 2012/0147664 A1* | 6/2012 | Rho | G11C 11/15 |
| | | | 365/158 |
| 2013/0064008 A1 | 3/2013 | Kim et al. | |
| 2013/0221995 A1 | 8/2013 | Hung | |
| 2014/0063897 A1* | 3/2014 | Guo | G11C 13/0021 |
| | | | 365/148 |
| 2014/0204652 A1* | 7/2014 | Lee | G11C 29/50008 |
| | | | 365/148 |
| 2014/0241070 A1 | 8/2014 | Wang et al. | |
| 2014/0268975 A1* | 9/2014 | Kitagawa | G11C 7/12 |
| | | | 365/63 |

OTHER PUBLICATIONS

International Search Report and Written Opinion—PCT/US2015/051208—ISA/EPO—May 20, 2016.

* cited by examiner

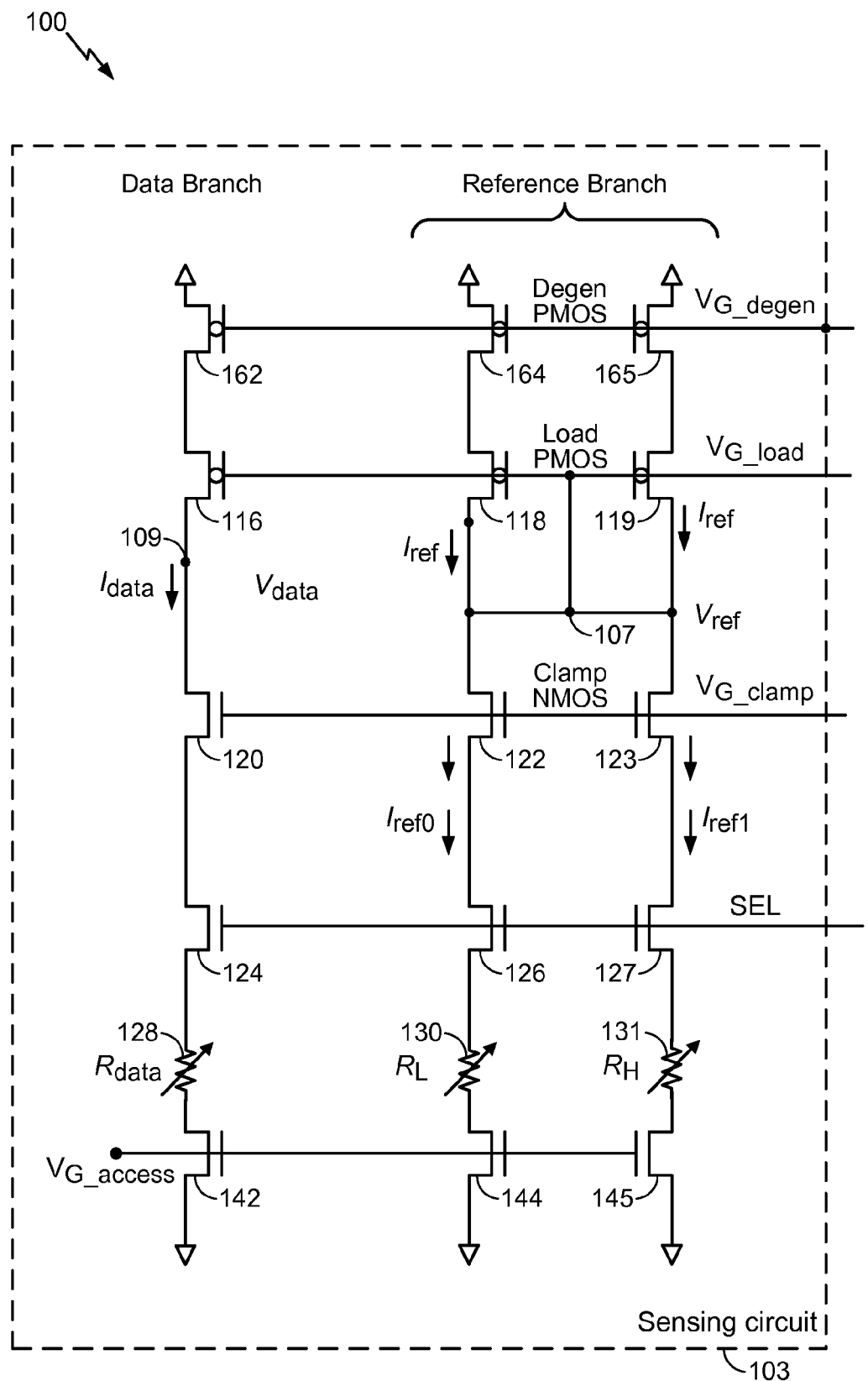
CONVENTIONAL
FIG. 1

CONSTANT SENSING CURRENT FOR READING RESISTIVE MEMORY

FIELD OF DISCLOSURE

Disclosed aspects are directed to providing a constant sensing current for reading or sensing data stored in resistive memory bit cells, where the constant sensing current does not vary with process-voltage-temperature (PVT) variations.

BACKGROUND

Memory devices conventionally include arrays of bit cells that each store a bit of data. Each data bit can represent a logical zero ("0") or a logical one ("1"), which may correspond to a state of the bit cell. During a read operation of a selected bit cell, a voltage level close to ground may be representative of "0" and a relatively higher voltage level may be representative of "1". Bit lines are coupled to various bit cells in the memory array and the bit lines couple the bit cells to other components used in read/write operations.

Magnetoresistive random access memory (MRAM) is a non-volatile memory technology where data is stored based on magnetization polarities of bit cells. In contrast to conventional RAM technologies which store data as electric charges or current flows, MRAM uses magnetic elements. A magnetic tunnel junction (MTJ) which is conventionally used as a storage element or bit cell for MRAM technology, can be formed from two magnetic layers, each of which can hold a magnetic moment, separated by an insulating (tunnel barrier) layer. Conventionally, the fixed layer is set to a particular polarity. The free layer's polarity is free to change to match that of an external magnetic field that can be applied. A change in the polarity of the free layer will change the resistance of the MTJ bit cell. For example, when the magnetization polarities are aligned or "parallel," a low resistance state ($R_L$) exists, which corresponds to a logical "0". When the magnetization polarities are not aligned or are "anti-parallel," a high resistance state ($R_H$) exists, which corresponds to a logical "1".

Thus, in magnetoresistive random access memory (MRAM), each bit cell (e.g., a MTJ bit cell) has a resistance value based on whether the bit cell represents a logical zero ("0") or a logical one ("1"). Specifically, the resistance of the bit cell ($R_{data}$) relates to the data stored in the bit cell.

Thus, in order to write a logical "0" or a logical "1," corresponding write currents are passed through the MTJ bit cell to effect a corresponding alignment of the free layer and the fixed layer, or in other words to program the MTJ bit cell to the corresponding resistance state.

In order to read the bit cell, a sensing current is passed through the bit cell and a voltage $V_{data}$ developed across the resistance $R_{data}$ is then compared to a reference voltage $V_{ref}$. If $V_{data}$ is high relative to $V_{ref}$ then the bit cell is determined to have a logical "1" stored therein. If $V_{data}$ is low relative to $V_{ref}$ then then the bit cell is determined to have a logical "0" stored therein. The difference between the voltage across the bit cell $V_{data}$ and the reference voltage $V_{ref}$ (differential voltage $\Delta V = V_{data} - V_{ref}$) is therefore used to indicate the logic state stored in the the bit cell. A sensing margin refers generally refers to the amount by which $\Delta V$ must be correctly sensed as positive or negative in order to correctly read the value stored in the bit cell as "1" or "0" respectively.

For the read operation, the sensing current needs to be less than the write currents used for writing the bit cell, in order to ensure that the data stored in the bit cell is not inadvertently flipped or reprogrammed during the read operation. If the read operation results in an undesired change in the logical value stored in the bit cell, this situation is referred to as a read disturbance.

A clamp transistor (e.g., a n-channel metal oxide semiconductor (NMOS) transistor) may be used to drive the sensing current through the bit cell. A gate voltage of the clamp transistor (or a clamp voltage $V_{G\_clamp}$) is adjusted or controlled in order to vary the amount of sensing current that is passed through the bit cell for a read operation. It may be desirable to maintain the clamp voltage $V_{G\_clamp}$ to a low value in order to keep the sensing current low, with a view to avoiding read disturbance.

However, reducing the clamp voltage $V_{G\_clamp}$ can lead to another undesirable effect which relates to a threshold voltage ($V_{th}$) of the clamp transistor. The threshold voltage of the clamp transistor is the minimum voltage that needs to be applied to the gate of the clamp transistor in order to activate the clamp transistor and cause it to drive the sensing current. If the clamp voltage $V_{G\_clamp}$ is too low, then there is a risk that the clamp voltage $V_{G\_clamp}$ may be lower than the threshold voltage $V_{th}$, which would prevent any sensing current from being driven to the bit cell. Further, the sensing current is also dependent on the difference between the clamp voltage $V_{G\_clamp}$ and the threshold voltage $V_{th}$. However, the threshold voltage $V_{th}$ can vary with process-voltage-temperature (PVT) conditions. Thus, the sensing current becomes heavily dependent on PVT variations, which makes the sensing operation unpredictable and unreliable.

Further, reducing the sensing current to a very low value can lead to a smaller sensing margin. A read access pass yield (RAPY) refers to a measure of a yield or percentage of read operations which result in a correct read value for a bit cell. Similarly, a read disturbance pass yield (RDPY) refers to a measure of yield or percentage of read operations which are not affected by read disturbance issues. For some PVT corners, for example, the variations in the sensing current may lead to an undesirably low sensing current, which can reduce the RAPY. At some other PVT corners, for example, the variation in sensing current can lead to an undesirably high sensing current which can result in a read disturbance.

Some conventional attempts to overcome the above problems with variation in sensing current include a bias generator which is configured to generate a clamp voltage $V_{G\_clamp}$ and reference voltage $V_{ref}$, by utilizing a current mirror and replica cells which are MTJ cells programmed to logical states "0" and "1" with corresponding resistances $R_L$ and $R_H$. These bias generators require current to be flowing to these replica cells, which may in turn create another source for read disturbance. Moreover, since current needs to be generated from the current mirror to pass through the replica cells during read operations on the MRAM bit cells, additional power is consumed in the process. Thus, the bias generators are not an effective solution due to at least the above drawbacks.

Accordingly, there is continuing need in the art for reliable and constant sensing currents for MRAM read operations, where the sensing currents do not vary with PVT variations.

SUMMARY

Disclosed systems and methods are directed to providing a constant sensing current for reading a resistive memory element such as a MRAM or MTJ bit cell using a load generator comprising a constant current source which is invariant with process-voltage-temperature variations.

For example, an exemplary aspect is directed to a method of reading a resistive memory bit cell, the method comprising: generating a load voltage from a current mirror which supplies a constant current that is invariant with process-voltage-temperature variations, generating a data voltage by providing the load voltage to a data load transistor coupled to the resistive memory bit cell, such that the constant current is mirrored as sensing current flowing through the resistive memory bit cell, and generating a reference voltage by providing the load voltage to reference load transistors coupled to reference cells, such that the constant current is mirrored as reference currents flowing through the reference cells.

Another exemplary aspect is directed to an apparatus comprising: a resistive memory bit cell and a load voltage generator configured to generate a load voltage. The load voltage generator comprises a current mirror, wherein the current mirror is configured to supply a constant current that is invariant with process-voltage-temperature variations. A data load transistor is coupled to the resistive memory bit cell, wherein a gate the data load transistor is coupled to the load voltage, and wherein the data load transistor is configured to generate a data voltage based on the constant current mirrored as sensing current passed through the resistive memory bit cell. Reference load transistors are coupled to reference cells, wherein gates of the reference load transistors are coupled to the load voltage, and wherein the reference load transistors are configured to generate a reference voltage based on the constant current mirrored as reference currents passed through the reference cells.

Yet another exemplary aspect is directed to a system comprising a resistive memory bit cell, means for generating a load voltage based on a constant current that is invariant with process-voltage-temperature variations, means for generating a data voltage based on the load voltage and the constant current mirrored as sensing current passed through the resistive memory bit cell, and means for generating a reference voltage based on the load voltage and the constant current mirrored as reference currents passed through reference cells.

BRIEF DESCRIPTION OF THE DRAWINGS

The accompanying drawings are presented to aid in the description of embodiments of the invention and are provided solely for illustration of the embodiments and not limitation.

FIG. 1 illustrates a conventional circuit for reading a MRAM bit cell.

DETAILED DESCRIPTION

Figure 2:
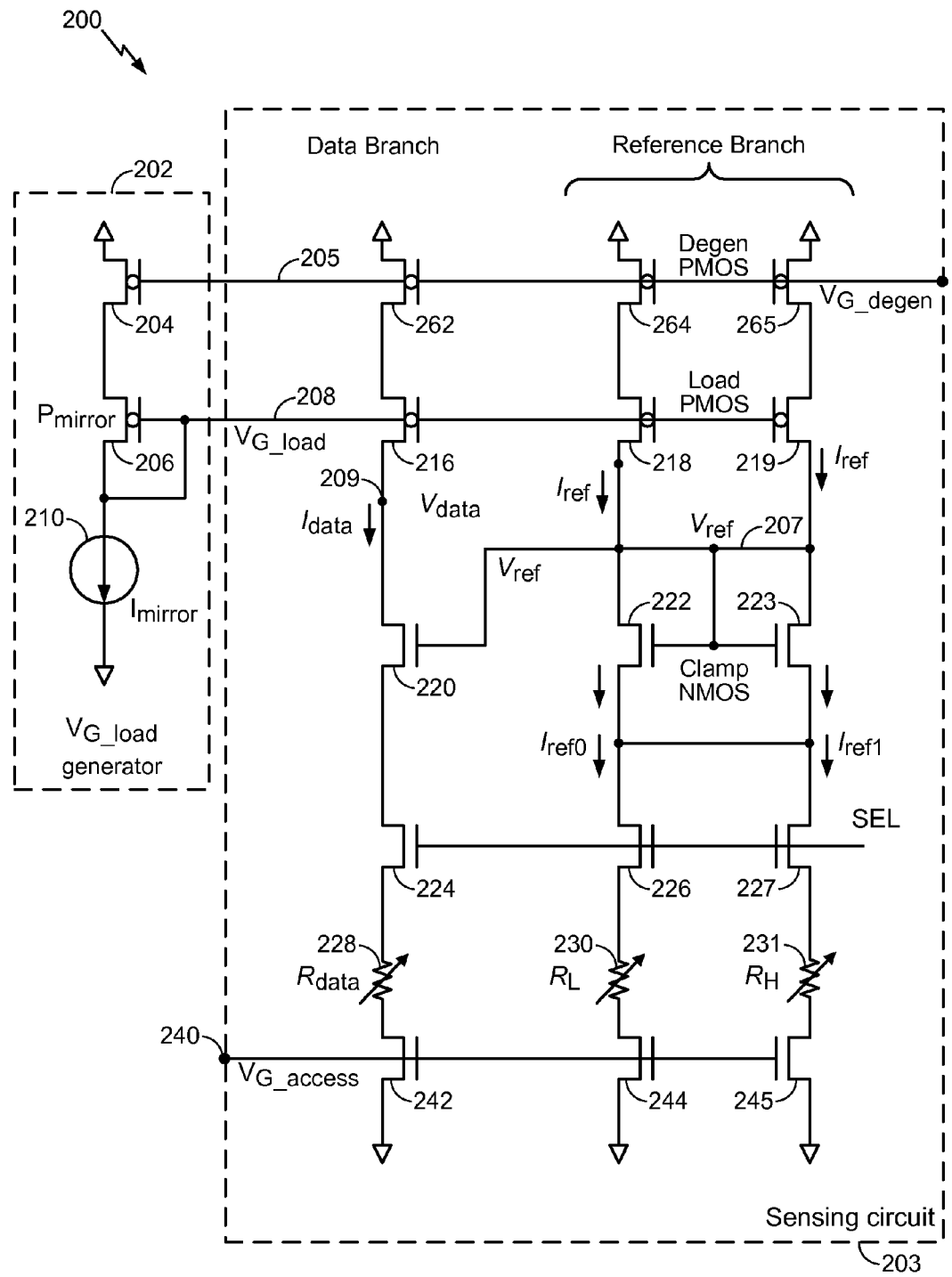
FIG. 2 illustrates an exemplary circuit for reading a MRAM bit cell using a sensing current which is invariant with process-voltage-temperature variations.

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The words "exemplary" and/or "example" are used herein to mean "serving as an example, instance, or illustration." Any embodiment described herein as "exemplary" and/or "example" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

In exemplary aspects, circuits and related techniques for providing a constant sensing current for reading resistive memory (e.g., MRAM) are provided. In this disclosure, although MRAM bit cells are discussed in exemplary aspects, it will be understood that the disclosed aspects are equally applicable to any resistive memory device or technology. In contrast to conventional approaches, the exemplary constant sensing current is invariant across PVT corners, provides sufficient sensing margin, and also avoids read disturbance. Thus, the RAPY is improved in exemplary aspects.

More specifically, in exemplary aspects, a constant sensing current generator or a load voltage ($V_{G\_load}$) generator is configured to provide a constant sensing current for read operations, wherein the constant sensing current is invariant with PVT variations. The $V_{G\_load}$ generator includes a current mirror coupled to a mirror transistor (e.g., a p-channel metal oxide semiconductor (PMOS) mirror transistor). A gate voltage of the mirror transistor provides the load voltage $V_{G\_load}$ to a data load transistor (e.g., a load PMOS of the bit cell, in a data branch which includes the bit cell). The load voltage $V_{G\_load}$ is adjusted to make a mirror current $I_{mirror}$ through the current mirror to be equal to the sensing current $I_{data}$. A reference circuit which is used to generate the aforementioned reference voltage $V_{ref}$ includes a reference load transistor (e.g., a load PMOS for one or more reference cells included in a reference branch) whose gate is also driven by $V_{G\_load}$.

As previously described, a data clamp transistor may be used to drive the sensing current through the bit cell. The gate voltage of the data clamp transistor (or a clamp voltage $V_{G\_clamp}$) is adjusted or controlled in order to vary the amount of sensing current that is passed through the bit cell for a read operation. The reference circuit also includes a diode-connected reference clamp transistor (e.g., a NMOS clamp transistor), whose saturation current is mirrored from that of the reference load transistor. The gate of the data clamp transistor for the bit cell is coupled to the gate of the reference clamp transistor. Since the gate voltages of the mirror transistor, the data load transistor, and the reference load transistor are all driven by the same load voltage $V_{G\_load}$, the mirror current $I_{mirror}=I_{data}$, which makes the sensing current across the constant and invariant with the PVT variations.

With reference now to FIG. 1, a conventional circuit 100 which includes a resistive memory element such as MRAM bit cell 128, is illustrated. More specifically, circuit 100 includes sensing circuit 103 used for reading the data value stored in bit cell 128 (e.g., a MTJ), which has a variable resistance $R_{data}$. Sensing circuit 103 is shown to comprise a data branch including bit cell 128 and a reference branch including reference cells 130 and 131. Load voltage $V_{G\_load}$ and clamp voltage $V_{G\_clamp}$ are provided from an external source to sensing circuit 103, and may vary with process variations, operating conditions, etc. Yet another signal, $V_{G\_access}$ may be provided to enable or disable circuit 100, for example, to conserve power. Data access transistor 142 and reference access transistors 144 and 145 (e.g., formed from NMOS transistors) may have their gates connected to access signal $V_{G\_access}$, such that these transistors may be turned off to conserve power when circuit 100 is not being used in a read operation, for example.

The data branch includes bit cell 128, which may be coupled to a data selection transistor 124 (e.g., a NMOS transistor), which may be enabled when a column multiplexor (not shown) coupled to a gate of data selection transistor 124, the column multiplexor to generate the signal "SEL" which is activated or driven high, in order to select bit cell 128 from other bit cells within the same row in which bit cell 128 exists in a memory array (e.g., a MRAM array, not shown in this view).

Bit cell 128 is coupled to data clamp transistor 120, whose gate is driven by clamp voltage $V_{G\_clamp}$, in order to supply data sensing current $I_{data}$. Bit cell 128 has data load transistor 116 (e.g., a PMOS transistor), whose gate is coupled to load voltage $V_{G\_load}$ and across which $V_{data}$ corresponding to the value stored in bit cell 128 is developed when $I_{data}$ is passed through bit cell 128. Data side degenerative (or "degen" transistor 162 (e.g., a PMOS transistor)) is provided in the data branch for reducing variations in current of data load transistor 116. Degen transistor 162 may act as a resistor coupled to a source terminal of data load transistor 116. Due to source degeneration effect, the variations in current through data load transistor 116 may be reduced.

The reference branch includes one or more reference cells which effectively provide a reference resistance $R_{ref}$ which may be used to generate the reference voltage for sensing bit cell 128. As shown, the reference branch includes two separate legs which include reference cells 130 and 131. Reference cell 130 may be programmed to a low resistance ($R_L$) corresponding to logical "0" and reference cell 131 may be programmed to a high resistance ($R_H$) corresponding to logical "1." The same column multiplexor output signal SEL that is connected to data selection transistor 124 may also be connected to reference selection transistors 126 and 127, which activates reference cells 130 and 131. Two reference clamp transistors 122 and 123 have their gates connected to clamp voltage $V_{G\_clamp}$, in order to provide the reference currents $I_{ref0}$ and $I_{ref1}$. Reference currents $I_{ref0}$ and $I_{ref1}$ flow through these reference cells 130 and 131 in order to generate an effective reference voltage $V_{ref}$ at node 107, across reference load transistors 118 and 119 (e.g., PMOS transistors), whose gates are also coupled to load voltage $V_{G\_load}$. Once again reference side degen transistors 164 and 165, whose functions are similar to degen transistor 162 discussed above, are coupled to reference load transistors 118 and 119. Thus, if data voltage $V_{data}$ at node 109 across bit cell 128 is higher than reference voltage $V_{ref}$ at node 107, then bit cell 128 is determined to have a resistance $R_H$ (i.e., logical "1") and if the voltage across bit cell 128 is lower than $V_{ref}$ then bit cell 128 has a resistance $R_L$ (i.e., logical "0").

However, as previously described, due to process variations, $V_{G\_load}$ and $V_{G\_clamp}$, which are externally supplied, may deviate from expected values. Further, due to mismatches between the transistors in circuit 100, the sensing margins may be affected. As a result the sensing current will vary, leading to deviations from expected values of $V_{data}$ and $V_{ref}$. Accordingly, the value stored in bit cell 128 may not be correctly read out as the differential voltage $\Delta V=V_{data}-V_{ref}$ may be incorrect.

With reference now to FIG. 2, exemplary circuit 200 is illustrated, which overcomes the above drawbacks of conventional circuit 100. In more detail, circuit 200 includes sensing circuit 203, as well as a component circuit, $V_{G\_load}$ generator 202. Initially, it will be noted that sensing circuit 203 may be configured or modified from conventional sensing circuit 103 of FIG. 1, with only minor modifications necessary, in order to incorporate exemplary aspects of providing a constant sensing current that is process invariant. Thus, FIG. 2 shows an example where the above-described circuits and/or techniques for providing a PVT invariant sensing current can be extended to existing MRAM circuit structures.

$V_{G\_load}$ generator 202 will first be described. In $V_{G\_load}$ generator 202 mirror transistor 206 (e.g., a PMOS transistor) is provided. Mirror transistor 206 may be diode-connected or configured as a diode, as shown. One terminal (e.g., source/drain) of mirror transistor 206 is connected to its gate and also connected to current mirror 210. Another terminal (e.g., drain/source) of mirror transistor 206 is coupled to load transistor 204 (e.g., a PMOS transistor), which is coupled to positive supply voltage $V_{dd}$. The gate of mirror transistor 206 is driven to the load voltage $V_{G\_load}$ 208. Deviating from conventional structures shown in circuit 100, where load voltage $V_{G\_load}$ was derived from an external voltage source, in exemplary circuit 200 of FIG. 2, load voltage $V_{G\_load}$ 208 is generated by $V_{G\_load}$ generator 202 and supplied to gates of data load transistor 216 and reference load transistors 218 and 219. This ensures that the constant current $I_{mirror}$ from current mirror 210 is mirrored to bit cell 228, which will be further described below. Additionally, a gate voltage of load PMOS is supplied as degen voltage $V_{G\_degen}$ 205, which is coupled to degen transistors 262, 264, and 265, for additional stability and resistance from process variations.

Coming now to sensing circuit 203, similar to sensing circuit 103, sensing circuit 203 also includes a data branch including bit cell 228 and a reference branch including reference cells 230 and 231. In this disclosure, although bit cell 228 may be described as a MRAM or MTJ bit cell in exemplary aspects, it will be understood that the disclosed aspects are equally applicable to bit cell 228 being formed from any resistive memory device or technology. Access signal $V_{G\_access}$ may also be similarly provided to enable or disable circuit 203, for example, to conserve power. Data access transistor 242 and reference access transistors 244 and 245 (e.g., formed from NMOS transistors) may have their gates connected to access signal $V_{G\_access}$, such that these transistors may be turned off to conserve power when circuit 200 is not being used in a read operation, for example. However, unlike sensing circuit 103, sensing circuit 203 derives its load voltage $V_{G\_load}$ 208 from $V_{G\_load}$ generator 202. Further, sensing circuit 203 does not have a clamp voltage $V_{G\_clamp}$ supplied by an external source. Instead, in sensing circuit 203, gates of reference clamp transistors 222 and 223 are connected to a common node 207, which is also connected to one terminal each of transistors 222 and 223, as well as to the gate of data clamp transistor 220. Reference voltage $V_{ref}$ is generated at node 207.

In more detail, bit cell 228 may be coupled to a data selection transistor 224 (e.g., a NMOS transistor). Bit cell 228 may be enabled when control signal "SEL" (which may be output from a column multiplexor, not shown in the figure) coupled to a gate of data selection transistor 224 is activated or driven high, in order to select bit cell 228 from other bit cells within the same row in which bit cell 228 exists in a memory array (e.g., a MRAM array, not shown in this view). Bit cell 228 is coupled to data clamp transistor 220, whose gate is connected to reference voltage $V_{ref}$ at node 207 as noted above. As previously described, data load transistor 216 has its gate connected to $V_{G\_load}$ 208 obtained from $V_{G\_load}$ generator 202, which means that sensing current $I_{data}$ through bit cell 228 is a constant current value that is mirrored from the current $I_{mirror}$ flowing through constant current source 210. Therefore, there will be no variations in sensing current $I_{data}$ which could result from process variations in conventional schemes. As previously noted, data side degenerative (or "degen" transistor 262 (e.g., a PMOS transistor)) is provided in the data branch for reducing variations in current of data load transistor 216. Degen transistor 262 may act as a resistor coupled to a source terminal of data load transistor 216. Due to source degeneration effect, the variations in sensing current $I_{data}$ through data load transistor 216 may be further reduced. Additionally, since the gate of degen transistor 262 is coupled to degen voltage $V_{G\_degen}$ 205 derived from the gate of load transistor 204 of $V_{G\_load}$ generator 202, additional stability of sensing current $I_{data}$ is achieved.

The reference branch includes reference cells 230 and 231. Reference cell 230 may be programmed to a low resistance ($R_L$) corresponding to logical "0" and reference cell 231 may be programmed to a high resistance ($R_H$) corresponding to logical "1." The same column multiplexor output SEL that is connected to data selection transistor 224 may also be connected to reference selection transistors 226 and 227, which activates reference cells 230 and 231. Two reference clamp transistors 222 and 223 have their gates connected to common node 207 as previously described. First terminals (e.g., drain terminals) of the two reference clamp transistors 222 and 223 are also connected to common node 207. Second terminals (e.g., source terminals) of the two reference clamp transistors 222 and 223 are connected together. This ensures that reference currents $I_{ref0}$ and $I_{ref1}$ are also mirrored appropriately from $I_{data}$. Reference currents $I_{ref0}$ and $I_{ref1}$ flow through reference cells 230 and 231 in order to generate an effective reference voltage $V_{ref}$ at the shared node 207, across reference load transistors 218 and 219 (e.g., PMOS transistors), whose gates are also coupled to load voltage $V_{G\_load}$ 208. Once again reference side degen transistors 264 and 265, whose functions are similar to degen transistor 262 discussed above, are coupled to reference load transistors 218 and 219.

With reference again to $V_{G\_load}$ generator 202, it is seen that current mirror 210 acts as a current sink which flows constant current (i.e., the mirror current $I_{mirror}$) across all PVT corners, and is invariant with PVT variations. The load voltage $V_{G\_load}$ 208 is determined by mirror transistor 206 (diode-connected PMOS) and the mirror current $I_{mirror}$ through current mirror 210. The saturation current of data load transistor 216 is thus mirrored from the mirror current $I_{mirror}$. Reference voltage $V_{ref}$ at node 207 is determined by diode-connected reference clamp transistors 222 and 223. This reference voltage $V_{ref}$ at node thus sets the saturation current of data clamp transistor 220 of the data branch because $V_{ref}=V_{G\_clamp}$ at node 207, which is coupled to the gate of reference clamp transistors 222 and 223. Therefore, even if there are PVT variations, the saturation current of data load transistor 216 of the data branch can be kept constant because the mirror current $I_{mirror}$ is constant. As seen, since this mirror current $I_{mirror}$ is mirrored to sensing current $I_{data}$ due to the saturation current of data load transistor 216, the sensing current $I_{data}$ is also invariant with PVT variations. Thus, issues with PVT variations and read disturbance can be avoided.

Accordingly, the determination of differential voltage $\Delta V=V_{data}-V_{ref}$ to assist in determining if data voltage $V_{data}$ at node 209 across bit cell 228 is higher than reference voltage $V_{ref}$ at node 207, will be free from process variations. Thus, bit cell 228 will be determined to have a resistance $R_H$ (i.e., logical "1") if the voltage across bit cell 228 is higher than $V_{ref}$; and if the voltage across bit cell 228 is lower than $V_{ref}$ then bit cell 228 will be determined to have a resistance $R_L$ (i.e., logical "0").

Figure 3:
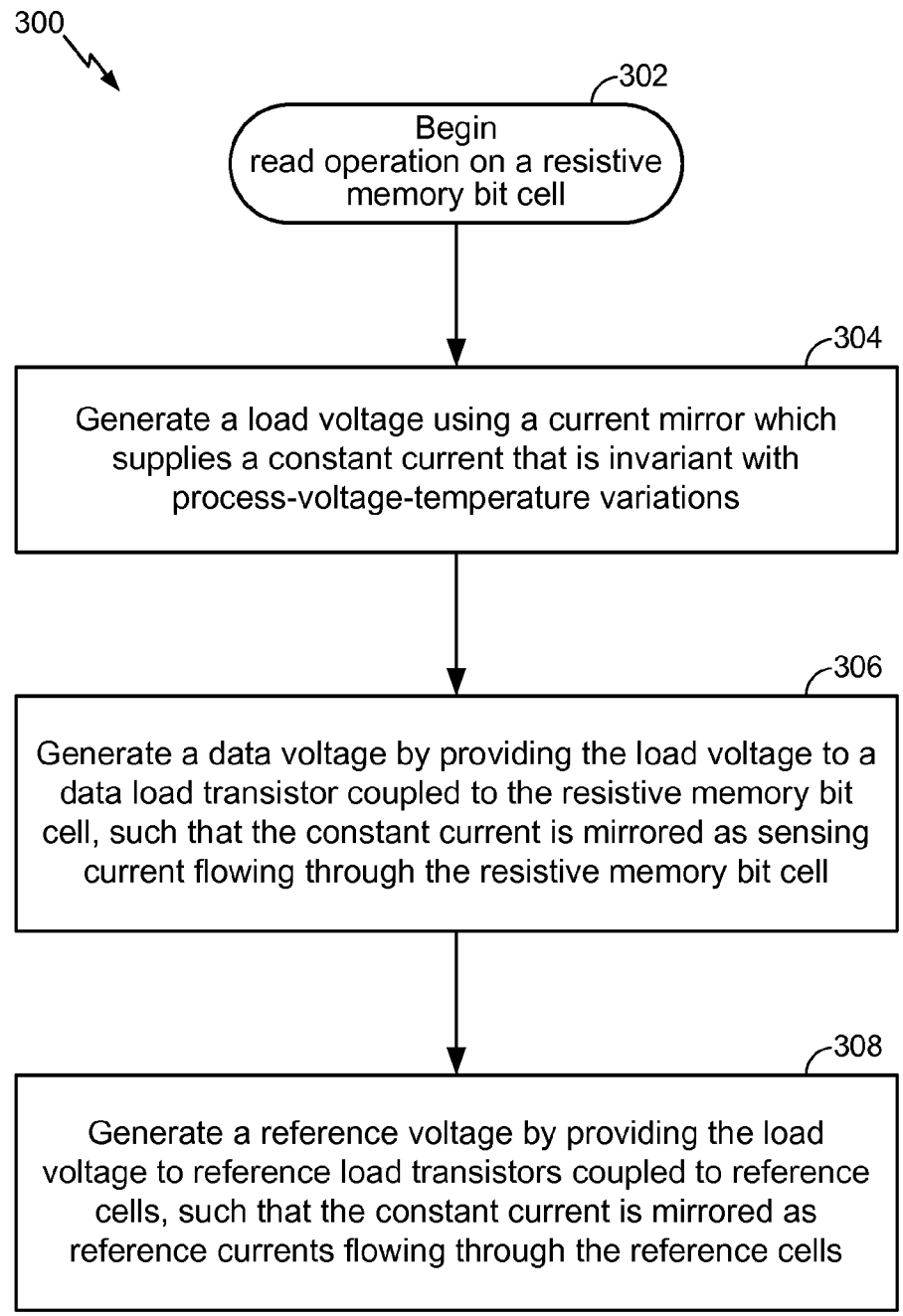
FIG. 3 illustrates a flow-chart pertaining to a method of reading a MRAM bit cell using a constant sensing current, according to exemplary aspects.

It will be appreciated that exemplary aspects include various methods for performing the processes, functions and/or algorithms disclosed herein. For example, as illustrated in FIG. 3, an exemplary aspect can include a method (300) of reading a resistive memory bit cell (e.g., 228). At Block 302, the method for reading the resistive memory bit cell begins. At Block 304 includes generating a load voltage (e.g., $V_{G\_load}$ 205) using a current mirror (e.g., current mirror 210) which supplies a constant current (e.g., $I_{mirror}$) that is invariant with process-voltage-temperature variations. Block 306 includes generating a data voltage (e.g., $V_{data}$ at node 209) by providing the load voltage to a data load transistor (e.g., 216) coupled to the resistive memory bit cell, such that the constant current is mirrored as sensing current (e.g., $I_{data}$) flowing through the resistive memory bit cell. Block 308 includes generating a reference voltage (e.g., $V_{ref}$ at node 207) by providing the load voltage to reference load transistors (e.g., 230, 231) coupled to reference cells, such that the constant current is mirrored as reference currents (e.g., $I_{ref1}$ and $I_{ref2}$) flowing through the reference cells.

Figure 4:
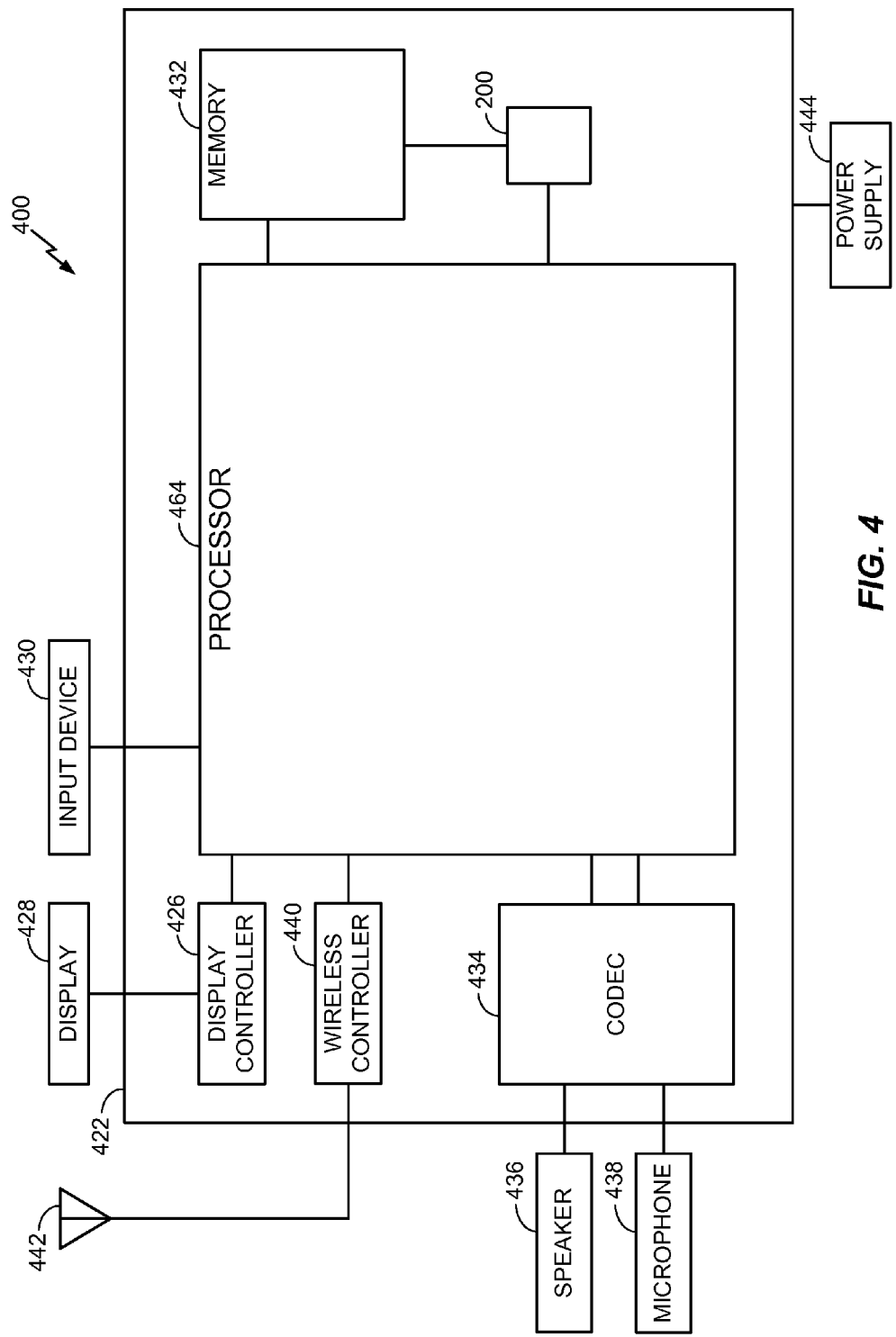
FIG. 4 illustrates a block diagram showing an exemplary wireless device in which exemplary aspects may be advantageously employed.

Referring to FIG. 4, a block diagram of a particular illustrative aspect of wireless device 400 configured according to exemplary aspects is depicted. Wireless device 400 includes processor coupled to memory 432. Memory 432 may include a MRAM array, and processor 464 and memory 432 may be coupled to circuit 200 of FIG. 2 for operating MRAM bit cells of the MRAM array in one aspect. FIG. 4 also shows display controller 426 that is coupled to processor 464 and to display 428. Coder/decoder (CODEC) 434 (e.g., an audio and/or voice CODEC) can be coupled to processor 464. Other components, such as wireless controller 440 (which may include a modem) are also illustrated. Speaker 436 and microphone 438 can be coupled to CODEC 434. FIG. 4 also indicates that wireless controller 440 can be coupled to wireless antenna 442. In a particular aspect, processor 464, display controller 426, memory 432, CODEC 434, and wireless controller 440 are included in a system-in-package or system-on-chip device 422.

In a particular aspect, input device 430 and power supply 444 are coupled to the system-on-chip device 422. Moreover, in a particular aspect, as illustrated in FIG. 4, display 428, input device 430, speaker 436, microphone 438, wireless antenna 442, and power supply 444 are external to the system-on-chip device 422. However, each of display 428, input device 430, speaker 436, microphone 438, wireless antenna 442, and power supply 444 can be coupled to a component of the system-on-chip device 422, such as an interface or a controller.

It should be noted that although FIG. 4 depicts a wireless communications device, processor 464 and memory 432 may also be integrated into a set-top box, a music player, a video player, an entertainment unit, a navigation device, a personal digital assistant (PDA), a fixed location data unit, a mobile phone, a smart phone, or a computer, and/or a semiconductor die.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Accordingly, an embodiment of the invention can include a computer readable media embodying a method of providing a constant sensing current that is invariant with PVT variations, for reading a resistive memory bit cell. Accordingly, the invention is not limited to illustrated examples and any means for performing the functionality described herein are included in embodiments of the invention.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal (e.g., UE). In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

While the foregoing disclosure shows illustrative aspects of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A method of reading a resistive memory bit cell, the method comprising:
   generating a load voltage at a gate of a mirror transistor, wherein the mirror transistor is diode-connected and coupled to a current mirror, wherein the current mirror supplies a constant current that is invariant with process-voltage-temperature variations;
   generating a data voltage by connecting the gate of the mirror transistor to a data load transistor coupled to the resistive memory bit cell, to provide the load voltage to the data load transistor such that the constant current is mirrored as sensing current flowing through the resistive memory bit cell;
   connecting the gate of the mirror transistor to reference load transistors coupled to reference cells, to provide the load voltage to the reference load transistors such that the constant current is mirrored as reference currents flowing through the reference cells;
   deriving a reference voltage at a common node which is coupled to first terminals of diode-connected reference clamp transistors coupled to the reference cells, wherein second terminals of the reference clamp transistors are connected to each other; and
   coupling the common node to a gate of a data clamp transistor coupled to the resistive memory bit cell.

2. The method of claim 1, comprising coupling the mirror transistor to a voltage generator load transistor, and deriving a degeneration voltage from a gate of the voltage generator load transistor.

3. The method of claim 2, further comprising driving gates of a degeneration data transistor coupled to the data load transistor and degeneration reference transistors coupled to the reference load transistors with the degeneration voltage.

4. The method of claim 1, further comprising determining a resistance value or logical value of the resistive memory bit cell based on a comparison of the data voltage and the reference voltage.

5. The method of claim 4, wherein a result of the comparison is invariant of process-voltage-temperature variations.

6. The method of claim 1, wherein the resistive memory bit cell is a magnetoresistive random access memory (MRAM) bit cell or a magnetic tunnel junction (MTJ).

7. An apparatus comprising:
   a resistive memory bit cell;
   a load voltage generator configured to generate a load voltage, the load voltage generator comprising a current mirror and a mirror transistor coupled to the current mirror, wherein the mirror transistor is diode-connected and the load voltage is generated at a gate of the mirror transistor, wherein the current mirror is configured to supply a constant current that is invariant with process-voltage-temperature variations;
   a data load transistor coupled to the resistive memory bit cell, wherein a gate of the data load transistor is connected to the gate of the mirror transistor to provide the load voltage to the data load transistor, and wherein the data load transistor is configured to generate a data voltage based on the constant current mirrored as sensing current passed through the resistive memory bit cell; and
   reference load transistors coupled to reference cells, wherein gates of the reference load transistors are connected to the gate of the mirror transistor to provide the load voltage to the reference load transistors such that the constant current is mirrored as reference currents flowing through the reference cells;
   diode-connected reference clamp transistors coupled to the reference cells, wherein first terminals of the reference clamp transistors are coupled to a common node configured to provide a reference voltage, and wherein second terminals of the reference clamp transistors are connected to each other; and
   a data clamp transistor coupled to the resistive memory bit cell, wherein the common node is coupled to a gate of the data clamp transistor.

8. The apparatus of claim 7, comprising a voltage generator load transistor coupled to the mirror transistor, wherein a gate of the voltage generator load transistor is configured to provide a degeneration voltage.

9. The apparatus of claim 8, further comprising a degeneration data transistor coupled to the data load transistor and degeneration reference transistors coupled to the reference load transistors, wherein gates of the degeneration data transistor and the degeneration reference transistors are coupled to the degeneration voltage.

10. The apparatus of claim 7, further comprising logic configured to determine a resistance value or logical value of the resistive memory bit cell based on a comparison of the data voltage and the reference voltage.

11. The apparatus of claim 10, wherein a result of the comparison is invariant of process-voltage-temperature variations.

12. The apparatus of claim 7, wherein the resistive memory bit cell is a magnetoresistive random access memory (MRAM) bit cell or a magnetic tunnel junction (MTJ).

13. The apparatus of claim 7, integrated in a semiconductor die.

14. The apparatus of claim 7, integrated in a device, selected from the group consisting of a set-top box, music player, video player, entertainment unit, navigation device, communications device, personal digital assistant (PDA), fixed location data unit, and a computer.

15. A system comprising:
   a resistive memory bit cell;
   means for generating a load voltage at a gate of a mirror transistor, based on a constant current that is invariant with process-voltage-temperature variations;
   means for generating a data voltage at a data load transistor of the resistive memory bit cell, the data load transistor connected to the gate of the mirror transistor, based on the load voltage and the constant current mirrored as sensing current passed through the resistive memory bit cell; and
   means for generating reference currents from the constant current, to be passed through reference cells, wherein reference load transistors are coupled to the reference cells, and the reference load transistor are connected to the gate of the mirror transistor;
   means for deriving a reference voltage at a common node which is coupled to first terminals of diode-connected reference clamp transistors coupled to the reference cells, wherein second terminals of the reference clamp transistors are connected to each other; and
   means for providing the reference voltage to a gate of a data clamp transistor coupled to the resistive memory bit cell.

16. The system of claim 15, further comprising means for determining a resistance value or logical value of the resistive memory bit cell based on a comparison of the data voltage and the reference voltage.

17. The system of claim 16, wherein a result of the comparison is invariant of process-voltage-temperature variations.

18. The system of claim 15, wherein the resistive memory bit cell is a magnetoresistive random access memory (MRAM) bit cell or a magnetic tunnel junction (MTJ).

\* \* \* \* \*